(12) United States Patent
Kang et al.

(10) Patent No.: US 7,642,810 B2
(45) Date of Patent: Jan. 5, 2010

(54) INPUT CIRCUIT FOR SEMICONDUCTOR INTEGRATED CIRCUIT

(75) Inventors: Shin-Deok Kang, Gyeonggi-do (KR); Dong-Uk Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 11/647,459

(22) Filed: Dec. 29, 2006

(65) Prior Publication Data

US 2007/0273406 A1 Nov. 29, 2007

(30) Foreign Application Priority Data

May 26, 2006 (KR) .................. 10-2006-0047403

(51) Int. Cl.
*H03K 19/094* (2006.01)
(52) U.S. Cl. .................. 326/83; 326/87; 327/109
(58) Field of Classification Search .................. 326/68, 326/82–83, 86–87, 115; 327/108–109, 333
See application file for complete search history.

(56) References Cited

U.S. PATENT DOCUMENTS

| | | | |
|---|---|---|---|
| 6,037,807 A * | 3/2000 | Wu et al. ................. 327/52 |
| 6,392,475 B1 | 5/2002 | Lee | |
| 6,429,700 B1 * | 8/2002 | Yang ................. 327/108 |
| 6,741,121 B2 * | 5/2004 | Huber ................. 327/563 |
| 7,205,797 B1 * | 4/2007 | Maheshwari et al. ......... 327/72 |
| 7,372,331 B2 * | 5/2008 | Menczigar et al. ......... 330/261 |
| 2006/0022706 A1 * | 2/2006 | Do ................. 326/57 |
| 2006/0066383 A1 | 3/2006 | Groiss | |
| 2007/0126477 A1 * | 6/2007 | Rho ................. 326/82 |

FOREIGN PATENT DOCUMENTS

| | | |
|---|---|---|
| KR | 10-1999-0004897 | 1/1999 |
| KR | 1020030006950 A | 1/2003 |
| KR | 1020030078334 A | 10/2003 |
| KR | 1020030087741 | 11/2003 |

* cited by examiner

*Primary Examiner*—Vibol Tan
*Assistant Examiner*—Jason Crawford
(74) *Attorney, Agent, or Firm*—Venable LLP; Jeffri A. Karminski

(57) ABSTRACT

An input circuit for a semiconductor integrated circuit in which an operational state is constant even when a process condition, a temperature, a voltage, and the like are varied at the time of operation is provided. The input circuit includes a first input unit that performs a first amplifying operation on a potential difference between a reference voltage and an input signal and outputs a result of the amplification, and a second input unit that performs a second amplifying operation on a signal amplified by the first input unit and outputs a result of the amplification.

38 Claims, 5 Drawing Sheets

INPUT CIRCUIT FOR SEMICONDUCTOR INTEGRATED CIRCUIT

BACKGROUND OF THE INVENTION

1. Technical Field

The present invention relates to a semiconductor integrated circuit, and more particularly, to an input circuit that receives a signal from the outside and transmits the received signal to an internal circuit.

2. Related Art

A semiconductor integrated circuit includes a signal transmitting unit that receives a signal and transmits it, and a signal processing unit that processes the signal transmitted by the signal transmitting unit according to a predetermined operation. The signal processing unit is generally called a core circuit of the semiconductor integrated circuit. In this core circuit, a large number of elements are integrated within an allowable range of design and process technologies of the semiconductor integrated circuit. The signal transmitting unit includes an input circuit and an output circuit disposed therein. The input circuit transmits a signal transmitted from the outside to the signal processing unit inside the semiconductor integrated circuit, and the output circuit outputs data transmitted by the signal processing unit to the outside.

Among semiconductor integrated circuits, in the case of a semiconductor memory, an input circuit mainly receives an address signal or data so as to transmit it to a memory core region inside the semiconductor memory, and an output circuit outputs a data signal corresponding to an input address to the outside of the memory.

As such, the input circuit receives a data signal or an address signal transmitted from outside of the input circuit and transmits it to an inner part of the semiconductor integrated circuit. The input circuit needs to perform an accurate buffering operation such that the semiconductor integrated circuit operates reliable.

FIG. 1 is a circuit diagram illustrating an input circuit for a semiconductor integrated circuit according to the related art. The input circuit according to the related art is generally implemented by a differential amplifier.

Referring to FIG. 1, the input circuit for a semiconductor integrated circuit according to the related art includes a MOS transistor Q1 that receives a reference voltage vref, a MOS transistor Q2 that receives an input signal in from the outside, two MOS transistors Q3 and Q4 that form a current mirror, two MOS transistors Q5 and Q6 for pull up that are enabled or disabled according to an enable signal enable, and a MOS transistor Q7 that receives the enable signal enable and drives differential amplifying operations of the two MOS transistors Q1 and Q2. The input circuit for a semiconductor integrated circuit further includes, as an output terminal, an inverter I1 that inverts a signal provided by a common node between the MOS transistors Q2 and Q4 and outputs an output signal out. Also, the input circuit of FIG. 1 uses a power supply voltage vdd and a ground voltage VSS as source voltages. The MOS transistors Q1 and Q2 operate as input transistors, the MOS transistors Q3, Q4, Q5, and Q6 operate as pull-up transistors, the MOS transistor Q7 operates as a driving transistor, and the inverter I1 operates as an output driver.

First, if the enable signal enable is input in a state where the enable signal enable is activated, that is, the enable signal enable becomes a high level, the MOS transistors Q5 and Q6 become disabled, and the MOS transistor Q7 becomes enabled, which provides a bias current of the MOS transistors Q1 and Q2.

The reference voltage vref is inputted to the MOS transistor Q1 in a state where it is maintained at a predetermined level. Meanwhile, if the input signal in is inputted to the MOS transistor Q2, the difference between the signals that are supplied from the MOS transistors Q3 and Q4 forming a current mirror to the two MOS transistors Q1 and Q2 is generated, due to the difference between the input signal in and the reference voltage vref. At this time, a signal that corresponds to the difference between the signals is transmitted to the input of the inverter I1. The inverter I1 inverts the input signal according to the size of the signal transmitted to the input of the inverter I1, and outputs an output signal out. For example, when the input signal in is inputted at a signal level higher than the reference voltage vref, a turned-on period of the MOS transistor Q2 is longer than that of the MOS transistor Q1, and a large amount of current flows through the MOS transistor Q2. As a result, the inverter I1 generates an output signal of a high level. In contrast, when the input signal in is inputted at a signal level lower than the reference voltage vref, the turned-on period of the MOS transistor Q2 is shorter than that of the MOS transistor Q1, and a small amount of current flows through the MOS transistor Q2. As a result, the inverter I1 generates an output signal of a low level.

Meanwhile, during a manufacturing process of the semiconductor integrated circuit, as a MOS transistor is manufactured according to process conditions, characteristics of the MOS transistor gradually varies. Also, a voltage level of the power supply voltage vdd can vary gradually with respect to the environment where the semiconductor integrated circuit operates. The operational characteristics of the MOS transistor that forms the input circuit also varies gradually according to an ambient temperature at the time of operation.

That is, the operational characteristics of all MOS transistors that form an input circuit also vary due to the variation in PVT (process, voltage, and temperature). As a result, even when a duty ratio of the input signal in inputted to the input circuit is constant, it varies while passing through the input circuit, and a duty ratio is distorted in an output signal out of the input circuit.

The input circuit is designed to have a structure in which even when an input signal input having a predetermined duty ratio becomes an output signal, the input signal is outputted with the predetermined duty ratio. However, as described above, the operational characteristic of the input circuit continuously varies according to the PVT, and when the input signal becomes the output signal out, the duty ratio is distorted. When the duty ratio is distorted, a margin of a setup/hold time is also reduced.

The setup/hold time refers to a margin in which the semiconductor integrated circuit can receive a desired signal according to a timing of a rising edge or a falling edge of a clock signal. When the duty ratio is distorted, the margin of the setup/hold time is reduced, and signals to be inputted to the semiconductor integrated circuit may not be securely inputted, which causes an erroneous operation.

SUMMARY OF THE INVENTION

Embodiments of the present invention provide an input circuit for a semiconductor integrated circuit that is capable of maintaining a stable operation even when process conditions, a temperature, and a voltage vary.

Another embodiment of the invention provides an input circuit for a semiconductor integrated circuit that is capable of surely coping with the variation in ambient environment conditions, and maintaining a constant operation.

Still another embodiment of the invention provides an input circuit for a semiconductor integrated circuit that is capable of reducing an influence due to the variation in process conditions, a temperature, and a voltage, and increasing a setup/hold time.

A first embodiment of the invention provides an input circuit for a semiconductor integrated circuit, which includes a first input unit that performs a first amplifying operation on a potential difference between a reference voltage and an input signal and outputs a result of the amplification, and a second input unit that performs a second amplifying operation on a signal amplified by the first input unit and outputs a result of the amplification.

A second embodiment of the invention provides an input circuit for a semiconductor integrated circuit, which includes a first input unit that is biased by a bias signal, and performs a first amplifying operation on a potential difference between a reference voltage and an input signal and outputs a result of the amplification, a second input unit that performs a second amplifying operation on a signal amplified by the first input unit and outputs a result of the amplification, a first bias signal providing unit that amplifies the reference voltage to a predetermined level on the basis of an operational state biased by the bias signal, and outputs a result of the amplification, and a second bias signal providing unit that compares a signal provided by the first bias signal providing unit and an internal reference voltage, amplifies a difference value, and generates the bias signal.

A third embodiment of the invention provides an input circuit for a semiconductor integrated circuit, which includes a first input unit that performs a first amplifying operation on a potential difference between a reference voltage and an input signal and outputs a result of the amplification, a second input unit that performs a second amplifying operation on a signal amplified by the first input unit and outputs a result of the amplification, and a bias signal proving unit that provides a bias signal such that the first input unit is driven by the bias signal. Preferably, the first input unit includes a differential amplifier that uses resistors as loads. Preferably, the second input unit includes a differential amplifier that uses MOS transistors as loads. Preferably, the bias signal providing unit includes a first bias signal providing unit that amplifies the reference voltage to a predetermined level on the basis of an operational state biased by the bias signal and outputs a result of the amplification, and a second bias signal providing unit that compares a signal outputted by the first bias signal providing unit and an internal reference voltage, amplifies a difference value, and generates the bias signal. Preferably, the second bias signal providing unit includes a resistance divider that outputs the internal reference voltage.

According to embodiments of the invention, the input circuit for a semiconductor integrated circuit is constructed in two stages. The input circuit receives the reference voltage and the input signal, performs an amplifying operation thereon, performs an amplifying operation on the amplified signal again as an input signal, and transmits it to an inner region. A first stage uses a resistor as a constant current source, an increases a swing width of a signal inputted to a second stage, and increases a voltage gain. When the voltage gain is increased, a distortion in a duty ratio can be reduced even when the variation in PVT occurs.

Further, even when an operational state of the first stage of the input circuit using the resistor varies due to the variation in PVT, the bias signal that is fed back by the same amplifier as the first stage is used in bias signal providing of the first stage, and the signal that is inputted to the second stage of the input circuit is adjusted. As a result, the duty ratio can be maintained to a predetermined value.

DESCRIPTION OF EXEMPLARY EMBODIMENTS

Embodiments of the invention will now be described in detail with reference to the accompanying drawings.

Figure 1:
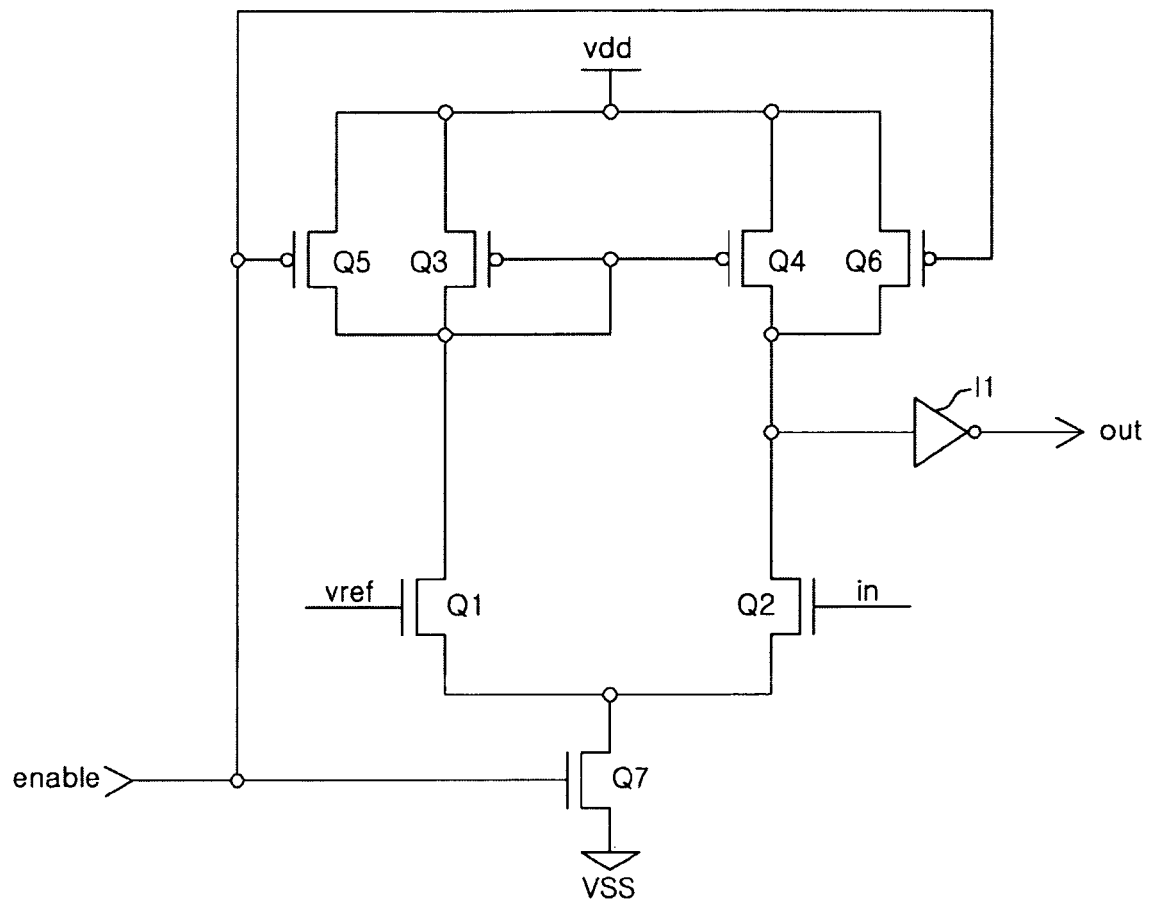
FIG. 1 is a circuit diagram illustrating an input circuit for a semiconductor integrated circuit according to the related art.
Figure 2:
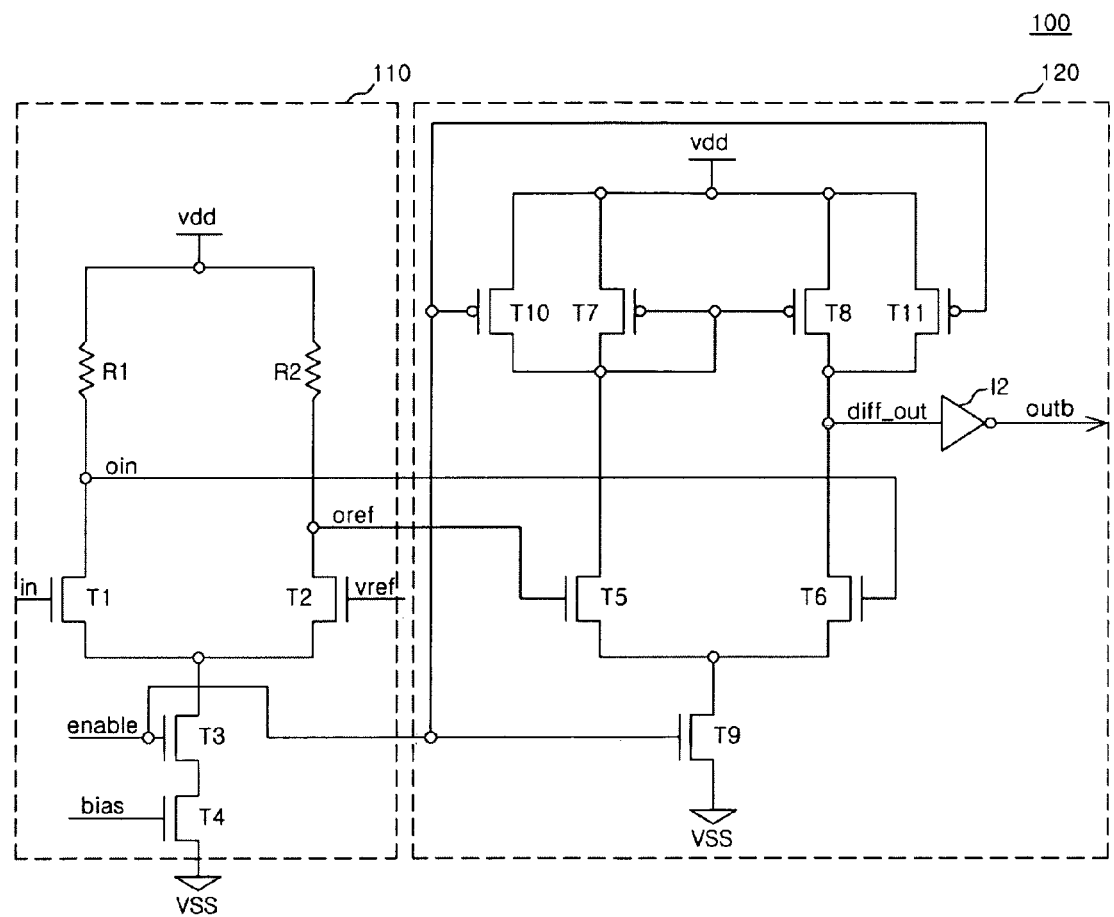
FIG. 2 is a circuit diagram illustrating an input circuit for a semiconductor integrated circuit according to an embodiment of the present invention.

Referring to FIG. 2, an input circuit 100 of a semiconductor integrated circuit according to an embodiment of the invention includes a first input unit 110 that performs a first amplifying operation on the difference between a reference voltage vref and an input signal in and outputs a result of the amplification; and a second input unit 120 that performs a second amplifying operation on the signal amplified by the first input unit 110 and outputs a result of the amplification.

The first input unit 110 includes a differential amplifier that uses resistors R1 and R2 as loads. The second input unit 120 includes a differential amplifier that uses MOS transistors T7 and T8 as loads.

The first input unit 110 includes the first resistor R1, the second resistor R2, and first to fourth MOS transistors T1 to T4. One end of each of the first and second resistors R1 and R2 is connected to a power supply voltage supply terminal vdd. The first MOS transistor T1 is connected to the first resistor R1, and is driven in response to the input signal in. The second MOS transistor T2 is connected to the second resistor R2 and operates in response to the reference voltage vref. The third MOS transistor T3 is connected in common to the first and second MOS transistors and is driven in response to an enable signal enable. The fourth MOS transistor T4 is connected to the third MOS transistor T3 and is driven in response to a bias signal bias. The other end (for example, source) of the fourth MOS transistor T4 is connected to a ground voltage supply terminal VSS. In the above-described structure, each of the first to fourth MOS transistors T1, T2, T3, and T4 is composed of an NMOS transistor. Further, the MOS transistors T1 and T2 operate as input transistors, and the resistors R1 and R2 operate as pull-up loads, and the MOS transistors T3 and T4 operate as driving transistors. Through this structure, a first output signal oin of the first input unit is outputted through a node to which the input transistor T1 is connected, and a second output signal oref of the first input unit is outputted through a node to which the input transistor T2 is connected.

The second input unit 120 includes fifth to eleventh MOS transistors T5 to T11. The fifth MOS transistor T5 has a gate that receives a signal applied to a common node between the second resistor R2 and the second MOS transistor T2. The sixth MOS transistor T6 has a gate that receives a signal applied to a common node between the first resistor R1 and the first MOS transistor T1. One end (i.e., source) of the seventh MOS transistor T7 is connected to the power supply voltage supply terminal vdd, and the other end (i.e., drain) thereof is connected to the fifth MOS transistor T5. One end (i.e., source) of the eighth MOS transistor T8 is connected to the power supply voltage supply terminal vdd, and the other end (i.e., drain) thereof is connected to one end of the sixth MOS transistor T6. A gate of the seventh MOS transistor T7 is connected to a gate of the eighth MOS transistor T8. Further, the gate of the seventh MOS transistor T7 is electrically connected to the other end (for example, drain) thereof. The ninth MOS transistor T9 has one end (i.e., drain) connected in common to the other ends (i.e., source) of the fifth and sixth MOS transistors T5 and T6, the other end (i.e., source) connected to the ground voltage supply terminal VSS, and a gate receiving an enable signal enable. The tenth MOS transistor T10 is disposed between the power supply voltage supply terminal vdd and one end of the seventh MOS transistor T7, and has a gate that receives the enable signal enable. The eleventh MOS transistor T11 is disposed between the power supply voltage supply terminal vdd and one end of the eighth MOS transistor T8, and has a gate that receives the enable signal enable. In the above-described structure, each of the fifth, sixth, and ninth MOS transistors T5, T6, and T9 may be composed of an NMOS transistor, and each of the seventh, eighth, tenth, and eleventh MOS transistors T7, T8, T10, and T11 may be composed of a PMOS transistor. Further, in the above-described structure, the MOS transistors T5 and T6 operate as input transistors, and the seventh, eighth, tenth, and eleventh MOS transistors T7, T8, T10, and T11 operate as pull-up transistors, and the ninth transistor T9 operates as a driving transistor. Through this structure, a differential amplifying signal diff_out is outputted through a node to which the input transistor T6 is connected, and a final output signal outb is outputted through an inverter I2.

Figure 3:
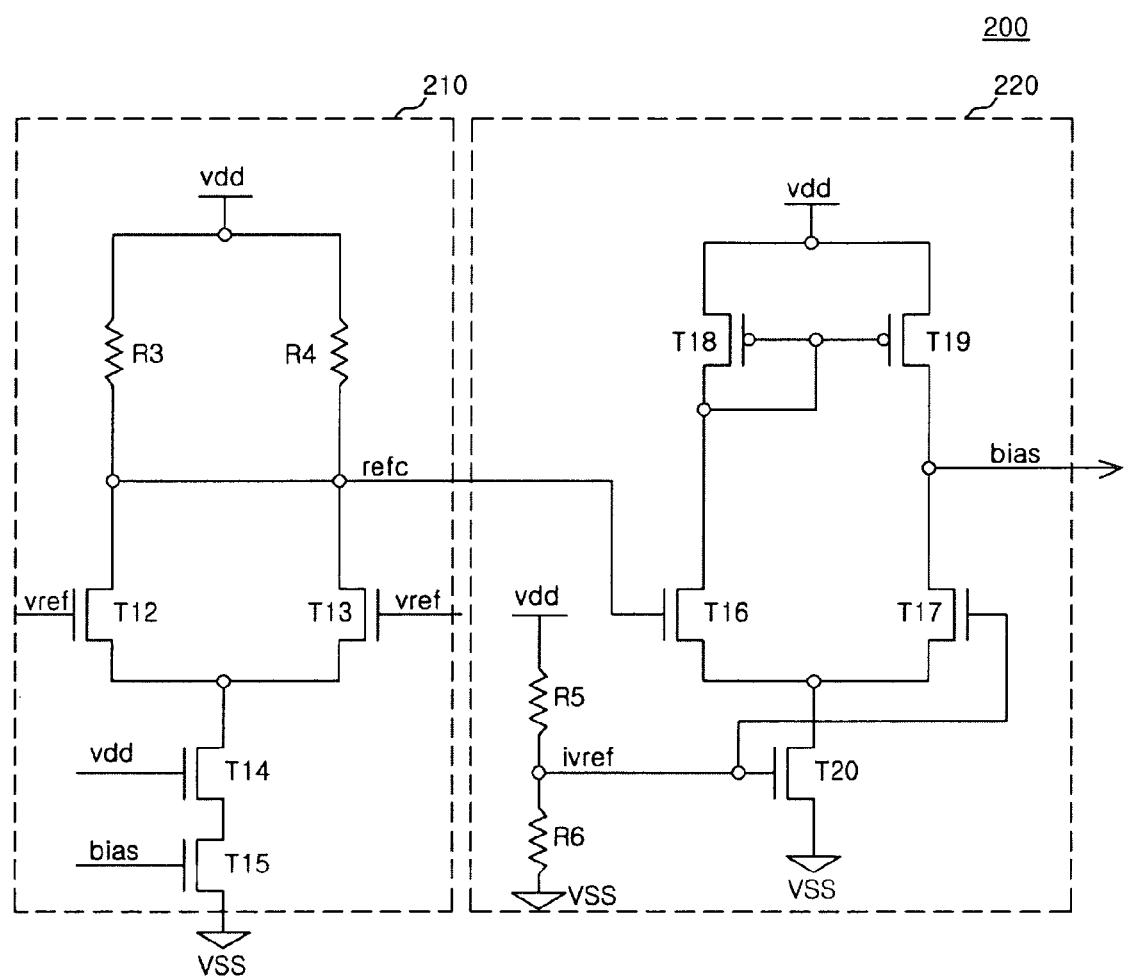
FIG. 3 is a circuit diagram illustrating a bias signal providing unit that provides a bias signal to an input circuit shown in FIG. 2.

FIG. 3 is a circuit diagram illustrating a bias signal providing unit that provides a bias signal bias to the input circuit shown in FIG. 2.

Referring to FIG. 3, the bias signal providing unit 200 includes a first bias signal providing unit 210 and a second bias signal providing unit 220.

The first bias signal providing unit 210 amplifies the reference voltage vref to a predetermined level on the basis of an operational state biased by the bias signal bias and outputs it. The first bias signal providing unit 210 includes a third resistor R3, a fourth resistor R4, and twelfth to fifteenth MOS transistors T12 to T15. One end of each of the third and fourth resistors R3 and R4 is connected to the power supply voltage supply terminal vdd. Specifically, the first bias signal proving unit 210 includes the third resistor R3, the fourth resistor R4 whose one end is connected to the power supply voltage supply terminal vdd, the twelfth MOS transistor T12 that has one end connected to the other end of the third resistor R3, and a gate supplied with the reference voltage vref, the thirteenth MOS transistor T13 that has one end connected to the other end of the fourth resistor R4, and a gate supplied with the reference voltage vref, the fourteenth MOS transistor T14 that has one end connected commonly to the other ends of the twelfth and thirteenth MOS transistors T12 and T13 and a gate connected to the power supply voltage supply terminal vdd, and the fifteenth MOS transistor T15 that has one end connected to the other end of the fourteenth MOS transistor T14, a gate receiving a bias signal bias, and the other end connected to the ground voltage supply terminal VSS. In the above-described structure, each of the twelfth to fifteenth MOS transistors T12, T13, T14, and T15 is composed of an NMOS transistor. In the above-described structure, the MOS transistors T12 and T13 operate as input transistors, the resistors R3 and R4 operate as pull-up loads, and the MOS transistors T14 and T15 operate as driving transistors. Through this structure, an output signal refc of the first bias providing unit is outputted through a common node to which the input transistors T12 and T13 are connected.

The second bias signal providing unit 220 compares a signal provided by the first bias signal providing unit 210 with an internal reference voltage iverf, and amplifies the signal according to the comparison result to generate a bias signal bias. The second bias signal providing unit 220 includes the fifth resistor R5, the sixth resistor R6, and the sixteenth to twentieth MOS transistors T16 to T20. Specifically, the fifth and sixth resistors R5 and R6 are connected in series between the power supply voltage supply terminal vdd and the ground voltage supply terminal VSS, and output an internal reference voltage ivref that is divided. The sixteenth MOS transistor T16 has a gate that receives the output signal refc of the first bias signal providing unit, and the seventeenth MOS transistor T17 has a gate that is supplied with the internal reference voltage ivref. The eighteenth MOS transistor T18 has an end connected to the power supply voltage supply terminal vdd, the other end connected to one end of the sixteenth MOS transistor T16, and a gate connected to a gate of the nineteenth MOS transistor T19 located at an opposite side. The nineteenth MOS transistor T19 has one end (i.e., source) connected to the power supply voltage supply terminal vdd, the other end (i.e., drain) connected to one end (i.e., drain) of the seventeenth MOS transistor T17, and a gate connected to the gate of the seventeenth MOS transistor T17. The twentieth MOS transistor T20 has one end (i.e., drain) connected in common to the other ends (i.e., drain) of the sixteenth and seventeenth MOS transistors T16 and T17, the other end (i.e., source) connected to the ground voltage supply terminal VSS, and a gate supplied with the internal reference voltage ivref. In the above-described structure, each of the sixteenth, seventeenth, and twentieth MOS transistors T16, T17, and T20 is composed of an NMOS transistor, and each of the eighteenth and nineteenth MOS transistors T18 and T19 is composed of a PMOS transistor. In the above-described structure, the MOS transistors T16 and T17 operate as input transistors, the eighteenth and nineteenth MOS transistors T18 and T19 operate as pull-up transistors, and the twentieth MOS transistor T20 operates as a driving transistor. Through this structure, the bias signal bias is outputted through a node to which the input transistor T17 is connected.

The operation of the input circuit for a semiconductor integrated circuit according to an embodiment of the invention will now be described with reference to FIGS. 2 and 3.

As shown in FIG. 2, the input circuit according to an embodiment of the invention includes two stages. When the enable signal enable is at a low level, voltage levels of the signals oin, oref, and dif_out at the nodes become a power supply voltage (vdd) level. As a result, the first input unit 110 and the second input unit 120 become disabled.

When the enable signal enable becomes a high level, the first input unit 110 becomes enabled. Further, a bias state of the first input terminal 110 is determined by the bias signal bias inputted to the gate of the fourth MOS transistor T4. The first input unit 110 outputs the result that is obtained by amplifying the difference between the reference voltage vref and the input signal in as two signals inputted to the first input unit 110 by a predetermined voltage gain.

The second input unit 120 also becomes enabled according to the enable signal enable, and outputs the result that is obtained by amplifying a voltage difference between two signals oin and oref supplied from the output nodes of the first input unit 110 by a predetermined voltage gain.

The input circuit according to an embodiment of the present invention includes the two input units, each of which performs an amplifying operation, and transmits the signal inputted to an inner part of the semiconductor integrated circuit by performing an amplifying operation twice. Accordingly, an amplified voltage gain in the input signal inputted to the input circuit is increased as compared with the related art, which reduces signal distortion due to the PVT.

Specifically, even when the second input unit 120 performs a distorted operation due to the PVT, the second input unit 120 again performs an amplifying operation on the signal that has been amplified by the first input unit 110, which reduces a signal distortion.

Meanwhile, the signal amplified by the first input unit 110 may be varied due to the PVT. The signal that has been distorted by the first input unit 110 may be further distorted by the second input unit 120.

However, if a biasing operation is performed at the first input terminal 110 using the bias signal bias provided by the first and second bias signal providing units 210 and 220, even when the characteristics of the first input unit 110 vary due to the PVT, that is, the characteristics between a resistor and a transistor in the first input unit 110 are distorted, the signals oin and oref the output nodes may be constant by means of the bias voltage.

As shown in FIG. 3, the first and second bias signal providing units 210 and 220 have structures similar to those of the first input unit 110 and the second input unit 120 shown in FIG. 2, and operate using a differential amplifying operation.

The first bias signal providing unit 210 is supplied with the reference voltages vref as the two input signals and outputs the output signal refc of the first bias signal providing unit, and the second bias signal providing unit 220 at a next stage receives the output signal refc of the first bias signal providing unit, compares a potential of the output signal refc of the first bias signal providing unit and a potential of an internal reference voltage ivref generated by a resistance divider in the second bias signal providing unit 220, and generates a bias signal bias. The bias signal bias that is generated in the above-described manner is fed back to the first bias signal providing unit 210, and adjusts the generation of the output signal refc of the first bias signal providing unit. The output signal refc of the first bias signal providing unit that is generated by using the signal fed back to the first bias signal providing unit 210 contributes to generate the bias signal bias again, and forms a loop.

Even when the characteristics between the resistor and the transistor in the first input unit 110 vary due to the variation in the PTV, the bias voltage, which is generated by the first bias signal generating unit 210 to which the same structure and characteristic as the first input unit 110 are applied, is adjusted. Accordingly, the output signals oin and oref that are outputted from the output nodes of the first input unit 110 can be maintained at a predetermined level without being influenced by the variation in the PVT.

Figure 4:
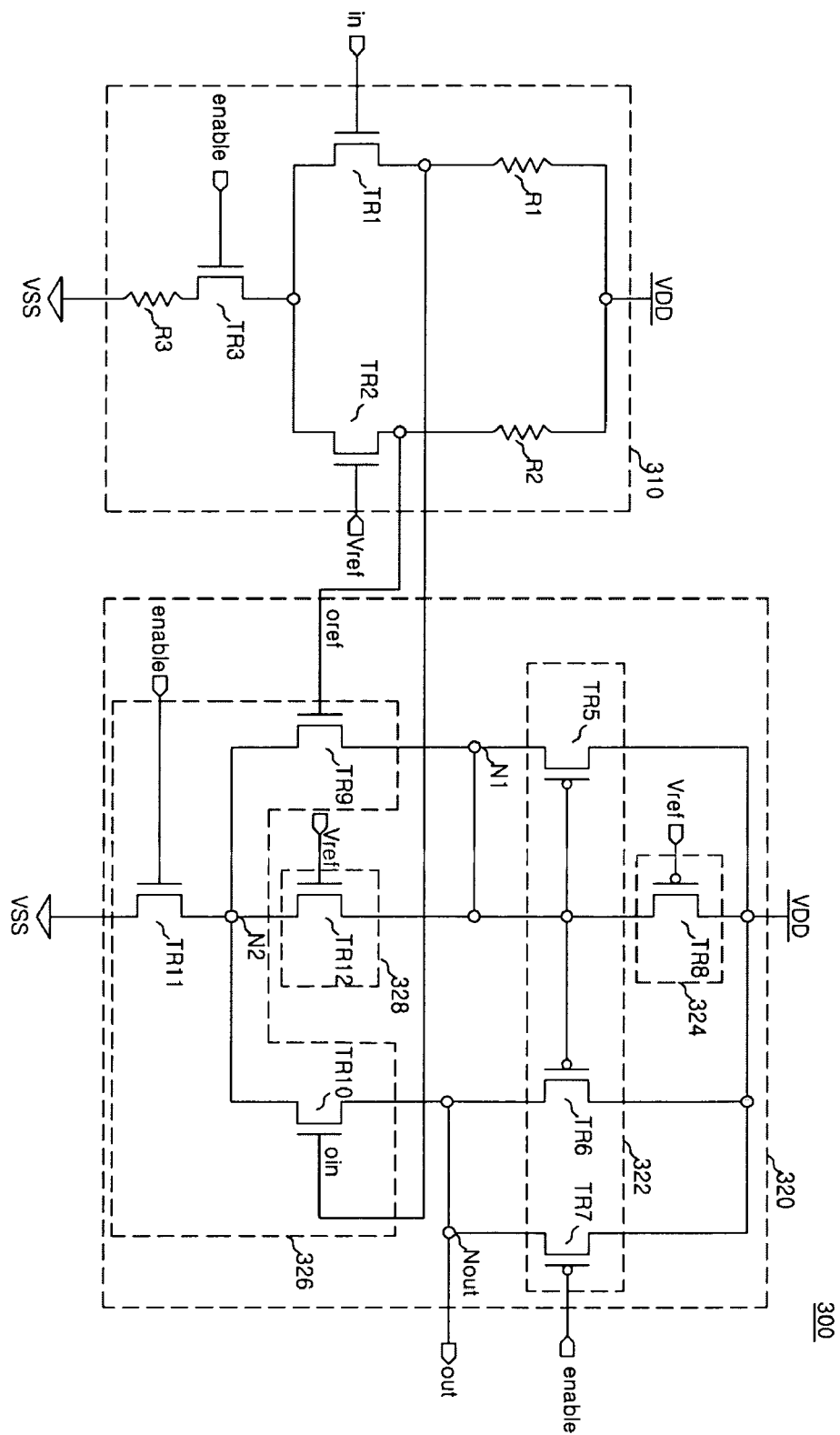
FIG. 4 is a circuit diagram illustrating an input circuit for a semiconductor integrated circuit according to another embodiment of the present invention.

FIG. 4 is a diagram illustrating a structure of an input circuit for a semiconductor integrated circuit according to another embodiment of the invention.

Similar to the input circuit for the semiconductor integrated circuit according to the first described embodiment of the invention, an input circuit 300 according to another embodiment of the invention includes a first input unit 310 that performs a first amplifying operation on a potential difference between a reference voltage vref and an input signal in, and a second input unit 320 that receives the signal amplified by the first input unit 310, compensates for a variation in the reference voltage Vref, and performs a second amplifying operation on the signal amplified by the first input unit 310.

The first input unit 310 according to this embodiment has the same structure as the first input unit 110 according to the above-described embodiment, except that a third resistor R3 is connected, instead of the fourth transistor T4 according to the above-described embodiment. Further, in order to discriminate between the above-described embodiment and the currently described embodiment, a transistor is denoted by reference character "TR".

The second input unit 320 includes a pull-up unit 322, a pull-up compensating unit 324, a pull-down unit 326, and a pull-down compensating unit 328.

The pull-up unit 322 operates in accordance with an enable signal enable, and supplies an external power supply voltage VDD to a first node N1 and an output node Nout according to a potential level at the first node N1. The pull-up unit 322 includes a fifth transistor TR5 that has one end (i.e., source) connected to a terminal of the external power supply voltage VDD, the other end (i.e., drain), and a gate commonly connected to the first node N1, a sixth transistor TR6 that has one end (i.e., source) connected to the terminal of the external power supply voltage VDD, the other end (i.e., drain) connected to the output node Nout, and a gate connected to the first node N1, and a seventh transistor TR7 that has one end connected to the terminal of the external power supply voltage VDD, the other end connected to the output node Nout, and a gate receiving the enable signal enable.

The pull-up compensating unit 324 compensates for a pull-up operation on the first node N1 and the output node Nout of the pull-up unit 322 according to a variation in the reference voltage Vref. The pull-up compensating unit 324 includes an eighth transistor TR8 that has one end (i.e., source) connected to the terminal of the external power supply voltage VDD, the other end (i.e., drain) connected to the first node N1, and a gate receiving the reference voltage Vref.

The pull-down unit 326 operates in accordance with the enable signal enable, and supplies a ground voltage VSS to the first node N1 and the output node Nout in response to a first output signal oin and a second output signal oref. The pull-down unit 326 includes a ninth transistor TR9 that has one end (i.e., drain) connected to the first node N1, the other end (i.e., source) connected to the second node N2, and a gate receiving the second output signal oref, a tenth transistor TR10 that has one end (i.e., drain) connected to the output node Nout, the other end (i.e., source) connected to the second node N2, and a gate receiving the first output signal oin, and an eleventh transistor TR11 that has one end (i.e., drain) connected to the second node N2, the other end (i.e., source) connected to a ground terminal, and a gate receiving the enable signal enable.

The pull-down compensating unit 328 compensates for a pull-down operation on the first node N1 and the output node Nout of the pull-down unit 326 according to the variation in the reference voltage Vref. The pull-down compensating unit 328 includes a twelfth transistor TR12 that has one end (i.e., drain) connected to the first node N1, the other end (i.e., source) connected to the second node N2, and a gate receiving the reference voltage Vref.

In this structure, a final output signal is output through the output node Nout.

As described above, the input circuit for the semiconductor integrated circuit according to the second embodiment of the present invention has two stages. If the enable signal enable is at a low level, the third transistor TR3 of the first input unit 310 is turned off, and the eleventh transistor TR11 of the second input unit 320 is turned off. Therefore, the input circuit does not perform an amplifying operation on the input signal in. At this time, since the seventh transistor TR7 is turned on, the final output signal out has a potential of a high level.

Meanwhile, if the enable signal is at a high level, the first input unit 310 and the second input unit 320 are activated, and perform an amplifying operation on the input signal in. The first input unit 310 amplifies the potential difference between the input signal in and the reference voltage Vref by a predetermined voltage gain, and outputs a result of the amplification. Also, the second input unit 320 amplifies the potential difference between the first output signal oin and the second output signal oref by a predetermined voltage gain, and outputs a result of the amplification.

The input circuit according to the second embodiment of the present invention includes the two input units, and performs the amplifying operations twice through the respective input units, such that the signal input from the outside of the input circuit is transmitted to the inside of the input circuit. Therefore, an amplified voltage gain of the input signal that is input to the input circuit and is subjected to an amplifying operation becomes larger than a voltage gain in the input circuit according to the related art that includes one differential amplifier, which reduces a signal distortion occurring due to the PVT.

Further, if a voltage level of the reference voltage Vref is decreased, a potential level of the second output signal oref is increased. As a result, a penetrating current the ninth transistor TR9 of the pull-down unit 326 is increased, and a potential level at the first node N1 is decreased. Since a penetrating current of the eighth transistor TR8 of the pull-up compensating unit 324 is increased, the potential at the first node N1 that is decreased by the ninth transistor TR9 is compensated for.

Meanwhile, if the voltage level of the reference voltage Vref is increased, the potential level of the second output signal oref is decreased. As a result, the penetrating current of the ninth transistor TR9 is decreased, and a potential level at the first node N1 is increased. At this time, since a penetrating current of the twelfth transistor TR12 of the pull-down compensating unit 328 is increased, the potential at the first node N1 that is increased by the eighth transistor TR8 is compensated for.

Figure 5:
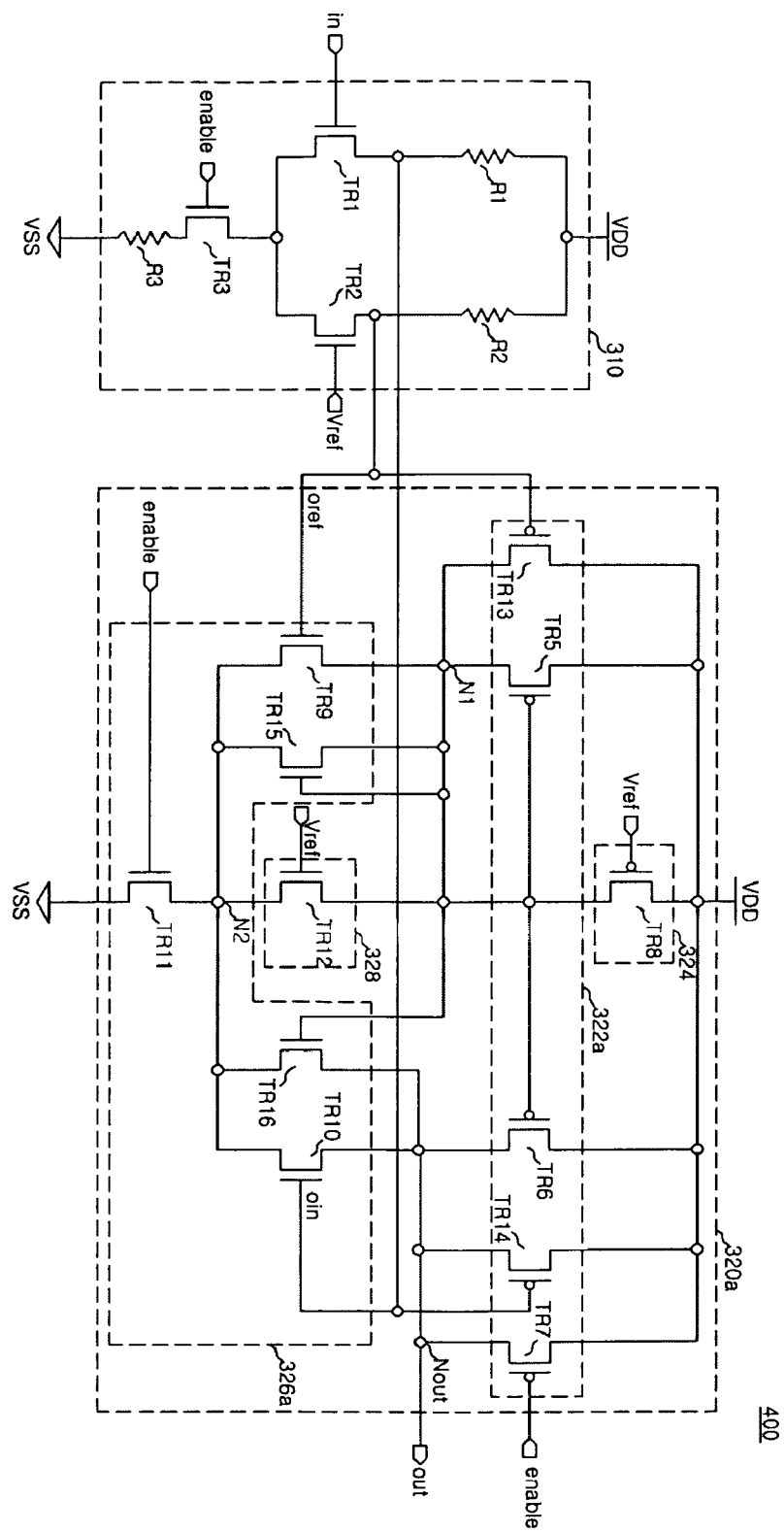
FIG. 5 is a circuit diagram illustrating an input circuit for a semiconductor integrated circuit according to still another embodiment of the invention.

FIG. 5 is a diagram illustrating a structure of an input circuit for a semiconductor integrated circuit according to a third embodiment of the invention.

An input circuit 400 for a semiconductor integrated circuit according to the third embodiment of the present invention may include a first input unit 310 and a second input unit 320a. The first input unit 310 may have the same structure as the first input unit 110 or 310 according to the above-described embodiments. Meanwhile, similar to the second input unit 320 according to the second embodiment of the invention, the second input unit 320a includes a pull-up unit 322a, a pull-up compensating unit 324, a pull-down unit 326a, and a pull-down compensating unit 328. The second input unit 320a according to still another embodiment of the present invention is different from the second input unit 320 in structures of the pull-up unit 322a and the pull-down unit 326a.

The pull-up unit 322a includes a fifth transistor TR5 that has one end (i.e., source) connected to a terminal of the external power supply voltage VDD, the other end (i.e., drain) and a gate commonly connected to the first node N1; a sixth transistor TR6 that has one end (i.e., source) connected to the terminal of the external power supply voltage VDD, the other end (i.e., drain) connected to the output node Nout, and a gate connected to the first node N1; a seventh transistor TR7 that has on end (i.e., source) connected to the terminal of the external power supply voltage VDD, the other end (i.e., drain) connected to the output node Nout, and a gate receiving the enable signal enable; a thirteenth transistor TR13 that has one end (i.e., source) connected to the terminal of the external power supply voltage VDD, the other end (i.e., drain) connected to the first node N1, and a gate receiving the second output signal oref; and a fourteenth transistor TR14 that has one end (i.e., source) connected to the terminal of the external power supply voltage VDD, the other end (i.e., drain) connected to the output node Nout, and a gate receiving the first output signal oin.

The pull-down unit 326a includes a ninth transistor TR9 that has one end (i.e., drain) connected to the first node N1, the other end (i.e., source) connected to the second node N2, and a gate receiving the second output signal oref; a tenth transistor TR10 that has one end (i.e., drain) connected to the output node Nout, the other end (i.e., source) connected to the second node N2, and a gate receiving the first output signal oin; an eleventh transistor TR11 that has one end (i.e., drain) connected to the second node N2, the other end (i.e., source) connected to a ground terminal, and a gate receiving the enable signal enable; a fifteenth transistor TR15 that has one end (i.e., drain) and a gate commonly connected to the first node N1 and the other end (i.e., source) connected to the second node N2; and a sixteenth transistor TR16 that has one end (i.e., drain) connected to the output node Nout, the other end (i.e., source) connected to the second node N2, and a gate connected to the first node N1.

In this structure, the first and sixth transistors TR5 and TR6 of the pull-up unit 322a operate opposed to the thirteenth and fourteenth transistors TR13 and TR14, and the ninth and tenth transistors TR9 and TR10 of the pull-down unit 326a operate opposed to the fifteenth and sixteenth transistors TR15 and TR16.

Therefore, the potential level variation widths of the first node N1 and the output node Nout due to the variation in the potential level of the reference voltage Vref are decreased, and it is possible to reduce the final output signal out from being affected by the reference voltage Vref, which improves the reliability.

That is, since the input circuit for the semiconductor integrated circuit according to embodiments of the invention has two stages, the input circuit has a sufficient voltage gain. Therefore, even though the operation characteristics of the MOS transistors that form the input circuit are changed due to the variation in the PVT, stable operations can be performed. Further, even though the voltage level of the reference voltage for comparison with the input signal is varied, it is possible to compensate for the variation in the potential level of the output signal, and thus the output signal has constant duty characteristics. Accordingly, the duty characteristics of the output signal can be stabilized, and the margin in the setup/hold time of the semiconductor integrated circuit can be increased.

It will be apparent to those skilled in the art that various modifications and changes may be made without departing from the scope and spirit of the invention. Therefore, it should be understood that the above embodiments are not limiting, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

When the semiconductor integrated circuit operates at a high speed, a timing of a setup/hold time is reduced, but it is difficult to reduce a skew and a jitter in the input circuit, because of the variation in processing, temperature, and a voltage level. However, the input circuit according to an embodiment of the invention includes two stages, and the bias signal providing unit similar to the input circuit is used. As a result, the input circuit can operate without depending on the above-described environmental variations. Therefore, it is possible to increase an operation margin of the setup/hold timing, making it possible to design an input circuit capable of reducing the setup/hold time.

What is claimed is:

1. An input circuit for a semiconductor integrated circuit, the input circuit comprising:
    a first input unit that amplifies a voltage difference between a reference voltage and an input signal, to output a result of the amplification as a first signal;
    a second input unit that further amplifies the first signal to output a result of the amplification as an output signal, wherein the first input unit receives a compensated bias signal and the compensated bias signal is obtained by comparing an amplified reference voltage and an internal reference voltage, and amplifying a result of the comparison;
    a first bias signal providing unit that amplifies the reference voltage to a predetermined level on the basis of an operational state biased by the compensated bias signal and outputs a result of the amplification; and
    a second bias signal providing unit that compares the result provided by the first bias signal providing unit and the internal reference voltage, amplifies the result of the comparison, and generates the compensated bias signal.

2. The input circuit of claim 1,
    wherein the first input unit includes a differential amplifier having resistors as loads.

3. The input circuit of claim 2,
    wherein the second input unit includes a differential amplifier having MOS transistors as loads.

4. The input circuit of claim 1,
    wherein the first input unit includes:
    a first resistor that has a first end connected to a power supply voltage supply terminal and a second end;
    a second resistor that has a first end connected to the power supply voltage supply terminal and a second end;
    a first MOS transistor that has a first end connected to the second end of the first resistor, a second end and a gate receiving the input signal;
    a second MOS transistor that has a first end connected to the second end of the second resistor, a second end and a gate supplied with the reference voltage;
    a third MOS transistor that has a first end connected in common to the second ends of the first and second MOS transistors, a second end and a gate receiving an enable signal; and
    a fourth MOS transistor that has a first end connected to the second end of the third MOS transistor, a gate receiving the compensated bias signal, and a second end connected to a ground voltage supply terminal.

5. The input circuit of claim 4,
    wherein the second input unit includes:
    a fifth MOS transistor that has a first end, a second end, and a gate receiving a signal applied to a common node between the second resistor and the second MOS transistor;
    a sixth MOS transistor that has a first end, a second end and a gate receiving a signal applied to a common node between the first resistor and the first MOS transistor;
    a diode-type seventh MOS transistor that has a first end connected to the power supply voltage supply terminal, a second end connected to the first end of the fifth MOS transistor, and a gate connected to the second end thereof;
    an eighth MOS transistor that has a first end connected to the power supply voltage supply terminal, the second end connected to the first end of the sixth MOS transistor, and a gate connected to the gate of the seventh MOS transistor;
    a ninth MOS transistor that has a first end connected in common to the second ends of the fifth and sixth MOS transistors, the second end connected to the ground voltage supply terminal, and a gate receiving the enable signal;
    a tenth MOS transistor that is disposed between the power supply voltage supply terminal and the first end of the seventh MOS transistor, and has a gate receiving the enable signal; and
    an eleventh MOS transistor that is disposed between the power supply voltage supply terminal and the first end of the eighth MOS transistor, and has a gate receiving the enable signal.

6. The input circuit of claim 5,
    wherein the first bias signal providing unit includes:
    a third resistor that has a first end connected to the power supply voltage supply terminal and a second end;
    a fourth resistor that has a first end connected to the power supply voltage supply terminal and a second end;
    a twelfth MOS transistor that has a first end connected to the second end of the third resistor, a second end, and a gate supplied with the reference voltage;
    a thirteenth MOS transistor that has a first end connected to the second end of the fourth resistor, a second end and a gate supplied with the reference voltage;
    a fourteenth MOS transistor that has a first end connected in common to the second ends of the twelfth and thirteenth MOS transistors, a second end, and a gate connected to the power supply voltage supply terminal; and
    a fifteenth MOS transistor that has a first end connected to the second end of the fourteenth MOS transistor, a gate receiving the compensated bias signal, and the second end connected to the ground voltage supply terminal.

7. The input circuit of claim 6,
    wherein the second bias signal providing unit includes:
    fifth and sixth resistors that are connected in series between the power supply voltage supply terminal and the ground voltage supply terminal;
    a sixteenth MOS transistor that has a gate receiving a signal applied to a common node between the third resistor and the thirteenth MOS transistor a first end, and a second end;
    a seventeenth MOS transistor that has a gate receiving a signal applied to a common node between the fifth and sixth resistors, a first end and a second end;
    a diode-type eighteenth MOS transistor that has a first end connected to the power supply voltage supply terminal, the second end connected to a first end of the sixteenth MOS transistor, and a gate connected to the second end;
    a nineteenth MOS transistor that has a first end connected to the power supply voltage supply terminal, the second end connected to a first end of the seventeenth MOS transistor, and a gate connected to the gate of the seventeenth MOS transistor; and a twentieth MOS transistor that has a first end connected in common to the second ends of the sixteenth and seventeenth MOS transistors, the second end connected to the ground voltage supply terminal, and a gate receiving a signal applied to a common node between the fifth and sixth resistors.

8. The input circuit of claim 1,
wherein the second input unit receives the signal input by the first input unit and changes the signal by a variation in the reference voltage.

9. The input circuit of claim 1,
wherein the second input unit includes a differential amplifier having MOS transistors as loads.

10. An input circuit for a semiconductor integrated circuit, the input circuit comprising:
a first input unit that is biased by a bias signal, and performs a first amplifying operation on a potential difference between a reference voltage and an input signal and outputs a result of the amplification;
a second input unit that performs a second amplifying operation on the result output by the first input unit and outputs a result of the amplification;
a first bias signal providing unit that amplifies the reference voltage to a predetermined level on the basis of an operational state biased by the bias signal, and outputs a result of the amplification; and
a second bias signal providing unit that compares the result provided by the first bias signal providing unit and an internal reference voltage, amplifies a difference value, and generates the bias signal.

11. The input circuit of claim 10,
wherein the first input unit includes a differential amplifier having resistors as loads.

12. The input circuit of claim 11,
wherein the second input unit includes a differential amplifier having MOS transistors as loads.

13. The input circuit of claim 11,
wherein the second input unit includes:
a fifth MOS transistor that has a gate receiving a signal applied to a common node between the second resistor and the second MOS transistor, a first end and a second end;
a sixth MOS transistor that has a gate receiving a signal applied to a common node between the first resistor and the first MOS transistor a first end and a second end;
a diode-type seventh MOS transistor that has a first end connected to the power supply voltage supply terminal, the second end connected to a first end of the fifth MOS transistor, and a gate connected to the second end thereof;
an eighth MOS transistor that has a first end connected to the power supply voltage supply terminal, the second end connected to a first end of the sixth MOS transistor, and a gate connected to the gate of the seventh MOS transistor;
a ninth MOS transistor that has a first end connected in common to the second ends of the fifth and sixth MOS transistors, the second end connected to the ground voltage supply terminal, and a gate receiving the enable signal;
a tenth MOS transistor that is disposed between the power supply voltage supply terminal and the a first end of the seventh MOS transistor, and has a gate receiving the enable signal; and an eleventh MOS transistor that is disposed between the power supply voltage supply terminal and the first end of the eighth MOS transistor, and has a gate receiving the enable signal.

14. The input circuit of claim 13,
wherein the first bias signal providing unit includes:
a third resistor that has a first end connected to the power supply voltage supply terminal and a second end;
a fourth resistor that has a first end connected to the power supply voltage supply terminal and a second end;
a twelfth MOS transistor that has a first end connected to the second end of the third resistor, a second end and has a gate supplied with the reference voltage;
a thirteenth MOS transistor that has a first end connected to the second end of the fourth resistor, a second end and a gate supplied with the reference voltage;
a fourteenth MOS transistor that has a first end connected in common to the second ends of the twelfth and thirteenth MOS transistors, a second end and a gate connected to the power supply voltage supply terminal; and
a fifteenth MOS transistor that has a first end connected to the second end of the fourteenth MOS transistor, a gate receiving the bias signal, and the second end connected to a ground voltage supply terminal.

15. The input circuit of claim 14,
wherein the second bias signal providing unit includes:
fifth and sixth resistors that are connected in series between the power supply voltage supply terminal and the ground voltage supply terminal;
a sixteenth MOS transistor that has a gate receiving a signal applied to a common node between the third resistor and the twelfth MOS transistor and a first end;
a seventeenth MOS transistor that has a gate receiving a signal applied to a common node between the fifth and sixth resistors and a first end;
a diode-type eighteenth MOS transistor that has a first end connected to the power supply voltage supply terminal, the second end connected to a first end of the sixteenth MOS transistor, and a gate connected to the second end thereof;
a nineteenth MOS transistor that has a first end connected to the power supply voltage supply terminal, second end connected to a first end of the seventeenth MOS transistor, and a gate connected to the gate of the seventeenth MOS transistor; and
a twentieth MOS transistor that has a first end connected in common to the second ends of the fifth and sixth MOS transistors, second end connected to the ground voltage supply terminal, and a gate receiving a signal applied to a common node between the fifth and sixth resistors.

16. The input circuit of claim 10,
wherein the first input unit includes:
a first resistor that has a first end connected to a power supply voltage supply terminal and a second end;
a second resistor that has a first end connected to the power supply voltage supply terminal and a second end;
a first MOS transistor that has a first end connected to the second end of the first resistor, a second end, and a gate receiving the input signal;
a second MOS transistor that has a first end connected to the second end of the second resistor, a second end and a gate supplied with the reference voltage;
a third MOS transistor that has a first end connected in common to the second ends of the first and second MOS transistors, a second end and a gate receiving an enable signal; and a fourth MOS transistor that has a first end connected to the second end of the third MOS transistor, a gate receiving the bias signal, and the second end connected to a ground voltage supply terminal.

17. An input circuit for a semiconductor integrated circuit, the input circuit comprising:
a bias signal providing unit that compares an amplified reference voltage with an internal reference voltage, and amplifies a result of the comparison thereby generating a bias signal;
a first input unit that is driven in response to the bias signal, compares and amplifies a difference between the reference voltages and input signals, and outputs a result of the comparison and amplification; and
a second input unit that amplifies signals outputted by the first input unit again and outputs a result of the amplification,
wherein the second input unit compares and amplifies two output signals of the first input unit such that the input signals are amplified in two stages, and wherein the bias signal providing unit includes:
a first bias signal providing unit that amplifies the reference voltage to a predetermined level on the basis of an operational state biased by the bias signal and outputs a result of the amplification; and
a second bias signal providing unit that compares the result outputted by the first bias signal providing unit and an internal reference voltage, amplifies a difference voltage, and generates the bias signal.

18. The input circuit of claim 17,
wherein the first input unit includes a differential amplifier resistors as loads.

19. The input circuit of claim 17,
wherein the second input unit includes a differential amplifier having MOS transistors as loads.

20. The input circuit of claim 17,
wherein the second bias signal providing unit includes a resistance divider that outputs the internal reference voltage.

21. An input circuit for a semiconductor integrated circuit comprising:
a first input unit that performs a first amplifying operation on a potential difference between a reference voltage and an input signal to provide an output signal; and
a second input unit that receives a signal amplified by the first input unit, compensates for a variation in the reference voltage, and performs a second amplifying operation on the signal wherein the second input unit includes:
a pull-up unit that operates in accordance with an enable signal, and supplies an external power supply voltage to a first node and an output node according to a potential level at the first node;
a pull-up compensating unit that compensates for a pull-up operation on the first node and the output node of the pull-up unit according to the variation in the reference voltage;
a pull-down unit that operates in accordance with the enable signal, and supplies a ground voltage to the first node and the output node in response to the output signal of the first input unit.

22. The input circuit of claim 21,
wherein the first input unit includes:
a first resistor that has a first end connected to an external power supply voltage supply terminal and a second end;
a second resistor that has a first end connected to the external power supply voltage supply terminal and a second end;
a first transistor that has a first end connected to the second end of the first resistor, a second end, and a gate receiving the input signal;
a second transistor that has a first end connected to the second end of the second resistor, a second end and a gate supplied with the reference voltage;
a third transistor that has a first end connected in common to the second ends of the first and second transistors, a second end and a gate receiving the enable signal; and
a third resistor that has a first end connected to the second end of the third transistor and the second end connected to a ground terminal,
a first output signal is output through a node to which the first transistor is connected, and
a second output signal is output through a node to which the second transistor is connected.

23. The input circuit of claim 21,
wherein the pull-up compensating unit increases an amount of current supplied from the external power supply voltage supply terminal to the first node, when a voltage level of the reference voltage is decreased.

24. An input circuit for a semiconductor integrated circuit comprising:
a first input unit that performs a first amplifying operation on a potential difference between a reference voltage and an input signal to provide an output signal; and
a second input unit that receives a signal amplified by the first input unit, compensates for a variation in the reference voltage, and performs a second amplifying operation on the signal,
wherein the second input unit includes:
a pull-up unit that operates in accordance an the enable signal, and supplies an external power supply voltage to a first node and an output node according to a potential level at the first node;
a pull-down unit that operates in accordance with the enable signal, and supplies a ground voltage to the first node and the output node in response to the output signal of the first input unit; and
a pull-down compensating unit that compensates for a pull-down operation on the first node and the output node of the pull-down unit according to the variation in the reference voltage.

25. The input circuit of claim 24,
wherein the pull-down compensating unit increases an amount of sync current from the first node to a ground terminal, when a voltage level of the reference voltage is increased.

26. The input circuit of claim 24,
wherein the pull-up unit includes:
a fourth transistor that has a first end connected to the external power supply voltage supply terminal, and a second end and a gate commonly connected to the first node;
a fifth transistor that has a first end connected to the external power supply voltage supply terminal, a second end connected to the output node, and a gate connected to the first node; and
a sixth transistor that has a first end connected to the external power supply voltage supply terminal, a second end connected to the output node, and a gate receiving the enable signal.

27. The input circuit of claim 26,
wherein the pull-up unit further includes;
a seventh transistor that has a first end connected to the external power supply voltage supply terminal, a second end connected to the first node, and a gate receiving the second output signal; and
an eighth transistor that has a first end connected to the external power supply voltage supply terminal, a second end connected to the output node, and a gate receiving the first output signal.

28. The input circuit of claim 24,
wherein the pull-down unit includes:
a fourth transistor that has a first end connected to the first node, a second end connected to a second node, and a gate receiving the second output signal;
a fifth transistor that has a first end connected to the output node, a second end connected to the second node, and a gate receiving the first output signal; and
a sixth transistor that has a first end connected to the second node, a second end connected to a ground terminal, and a gate receiving the enable signal.

29. The input circuit of claim 28,
wherein the pull-down unit further includes;
a seventh transistor that has a first end and a gate connected to the first node, and a second end connected to the second node; and
an eighth transistor that has a first end connected to the output node, a second end connected to the second node, and a gate receiving the first output signal.

30. An input circuit for a semiconductor integrated circuit comprising: a first input unit that performs a first amplifying operation on a potential difference between a reference voltage and an input signal; and a second input unit that performs a second amplifying operation on the signal output by the first input unit, wherein the second input unit includes: a pull-up unit that operates in accordance with an enable signal; a pull-up compensating unit that compensates for a pull-up operation on a reference node and an output node according to a variation in the reference voltage; a pull-down unit that operates in accordance with the enable signal; and a pull-down compensating unit that compensates for a pull-down operation on the reference node and the output node according to the variation in the reference voltage, wherein the pull-up compensating unit and the pull-down compensating unit are configured to compensate an amount of current in the reference node in response to the variation in the reference voltage.

31. The input circuit of claim 30, wherein the first input unit includes: a first resistor that has a first end connected to an external power supply voltage supply terminal and a second end; a second resistor that has a first end connected to the external power supply voltage supply terminal and a second end; a first transistor that has a first end connected to the second end of the first resistor, a second end, and a gate receiving the input signal; a second transistor that has a first end connected to the second end of the second resistor, a second end, and a gate supplied with the reference voltage; a third transistor that has a first end connected in common to the second ends of the first and second transistors, a second end and a gate receiving the enable signal; and a third resistor that has a first end connected to the second end of the third transistor and a second end connected to a ground terminal, a first output signal is output through a node to which the first transistor is connected, and a second output signal is output through a node to which the second transistor is connected.

32. The input circuit of claim 30,
wherein the pull-up compensating unit increases an amount of current supplied from the external power supply voltage supply terminal to the reference node, when a voltage level of the reference voltage is decreased.

33. The input circuit of claim 30,
wherein the pull-down compensating unit increases an amount of sync current from the reference node to a ground terminal, when a voltage level of the reference voltage is increased.

34. The input circuit of claim 30, wherein the second input unit further includes: the pull-up unit supplying the external power supply voltage to the reference node and an output node according to a potential level at the reference node; and the pull-down unit supplying a ground voltage to the reference node and the output node in response to the first and second output signals.

35. The input circuit of claim 34,
wherein the pull-down unit includes:
a fourth transistor that has a first end connected to the reference node, a second end connected to a first node, and a gate receiving the second output signal;
a fifth transistor that has a first end connected to the output node, a second end connected to the first node, and a gate receiving the first output signal; and
a sixth transistor that has a first end connected to the first node, a second end connected to a ground terminal, and a gate receiving the enable signal.

36. The input circuit of claim 35,
wherein the pull-down unit further includes;
a seventh transistor that has a first end and a gate connected to the reference node, and a second end connected to the first node; and
an eighth transistor that has a first end connected to the output node, a second end connected to the first node, and a gate receiving the first output signal.

37. The input circuit of claim 30,
wherein the pull-up unit includes:
a fourth transistor that has a first end connected to the external power supply voltage supply terminal, and a second end and a gate commonly connected to the reference node;
a fifth transistor that has a first end connected to the external power supply voltage supply terminal, a second end connected to the output node, and a gate connected to the reference node; and
a sixth transistor that has a first end connected to the external power supply voltage supply terminal, a second end connected to the output node, and a gate receiving the enable signal.

38. The input circuit of claim 37,
wherein the pull-up unit further includes;
a seventh transistor that has a first end connected to the external power supply voltage supply terminal, a second end connected to the reference node, and a gate receiving the second output signal; and
an eighth transistor that has a first end connected to the external power supply voltage supply terminal, a second end connected to the output node, and a gate receiving the first output signal.

* * * * *